(12) United States Patent
Bao et al.

(10) Patent No.: US 10,288,804 B2
(45) Date of Patent: May 14, 2019

(54) METHOD TO FABRICATE CHIP-SCALE ELECTRONIC PHOTONIC (PLASMONIC)-INTEGRATED CIRCUITS

(71) Applicant: University of Houston System, Houston, TX (US)

(72) Inventors: Jiming Bao, Pearland, TX (US); Zhuan Zhu, Houston, TX (US); Zhiming Wang, Katy, TX (US)

(73) Assignee: UNIVERSITY OF HOUSTON SYSTEM, Houston, TX (US)

( * ) Notice: Subject to any disclaimer, the term of this patent is extended or adjusted under 35 U.S.C. 154(b) by 0 days.

(21) Appl. No.: 15/736,941

(22) PCT Filed: Jul. 6, 2016

(86) PCT No.: PCT/US2016/041129
§ 371 (c)(1),
(2) Date: Dec. 15, 2017

(87) PCT Pub. No.: WO2017/007816
PCT Pub. Date: Jan. 12, 2017

(65) Prior Publication Data
US 2018/0172908 A1      Jun. 21, 2018

Related U.S. Application Data

(60) Provisional application No. 62/188,905, filed on Jul. 6, 2015.

(51) Int. Cl.
*G02B 6/122* (2006.01)
*C01B 19/00* (2006.01)
(Continued)

(52) U.S. Cl.
CPC .......... *G02B 6/1226* (2013.01); *C01B 19/007* (2013.01); *C01G 39/06* (2013.01);
(Continued)

(58) Field of Classification Search
CPC .............................. G02B 6/107; G02B 6/1226
See application file for complete search history.

(56) References Cited

U.S. PATENT DOCUMENTS 8,110,823 B2    2/2012  Bowers
8,280,214 B2   10/2012  Yang et al.
(Continued)

FOREIGN PATENT DOCUMENTS

WO    WO-2014043045 A1    3/2014

OTHER PUBLICATIONS

Fengnian Xia, et al., "Two-dimensional material nanophotonics", Nature Photonics, Nov. 27, 2014, pp. 1-17.
(Continued)

*Primary Examiner* — Daniel Petkovsek
(74) *Attorney, Agent, or Firm* — Winstead PC

(57) ABSTRACT

Electronic-photonic integrated circuits (EPICs), such a monolithically integrated circuit, are considered to be next generation technology that takes advantage of high-speed optical communication and nanoscale electronics. Atomically thin transition metal dichalcogenides (TMDs) may serve as a perfect platform to realize EPIC. The generation and detection of light by a monolayer TMD at nanoscale through surface plasmon polaritons (SPPs) may be utilized to provide optical communication. The bidirectional nature of the TMDs allow such a layer to be utilizes as part of emitters or photodetectors for EPICs.

20 Claims, 6 Drawing Sheets

(51) Int. Cl.
*C01G 39/06* (2006.01)
*C01G 41/00* (2006.01)
*G02B 6/10* (2006.01)
*G02B 6/30* (2006.01)
*H01L 31/0224* (2006.01)
*H01L 33/38* (2010.01)

(52) U.S. Cl.
CPC ............. *C01G 41/00* (2013.01); *G02B 6/107* (2013.01); *G02B 6/30* (2013.01); *H01L 31/022408* (2013.01); *H01L 33/38* (2013.01)

(56) References Cited

U.S. PATENT DOCUMENTS

| | | | |
|---|---|---|---|
| 8,509,276 | B2 | 8/2013 | Zhang et al. |
| 8,741,684 | B2 | 6/2014 | Bogaerts et al. |
| 8,803,268 | B2 | 8/2014 | Heck et al. |
| 8,901,576 | B2 | 12/2014 | Doany et al. |
| 9,991,390 | B2 * | 6/2018 | George ............ H01L 21/02381 |
| 2010/0258784 | A1 | 10/2010 | Lukin et al. |
| 2012/0118045 | A1 | 5/2012 | Tao et al. |
| 2013/0077640 | A1 | 3/2013 | Jiang et al. |
| 2014/0056551 | A1 * | 2/2014 | Liu ........................ G02F 1/025 385/2 |
| 2014/0153873 | A1 | 6/2014 | Kang et al. |
| 2014/0185981 | A1 | 7/2014 | Assefa et al. |
| 2014/0245946 | A1 | 9/2014 | Kong et al. |
| 2014/0269806 | A1 | 9/2014 | Bora et al. |
| 2017/0250075 | A1 * | 8/2017 | Caymax ............ H01L 21/02568 |
| 2018/0019422 | A1 * | 1/2018 | Wu ..................... H01L 51/4253 |

OTHER PUBLICATIONS

S. Najmaei et al., *Vapour phase growth and grain boundary structure of molybdenum disulphide atomic layers*, Nat. Mater. 2013, 12, 754.

C. X. Cong et al., *Synthesis and Optical Properties of Large-Area Single-Crystalline 2D Semiconductor WS2 Monolayer from Chemical Vapor Deposition*, Adv. Opt. Mater. 2014, 2, 131.

* cited by examiner

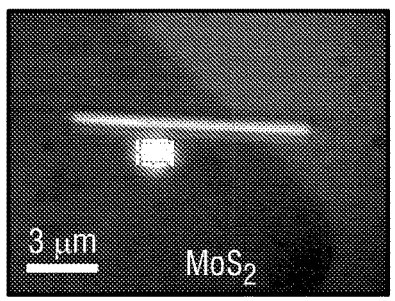
FIG. 6a
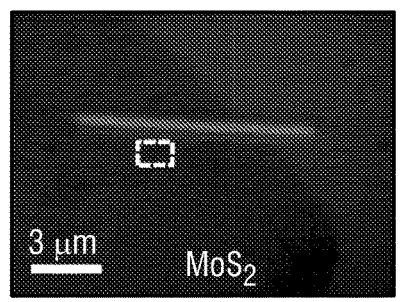
FIG. 6b
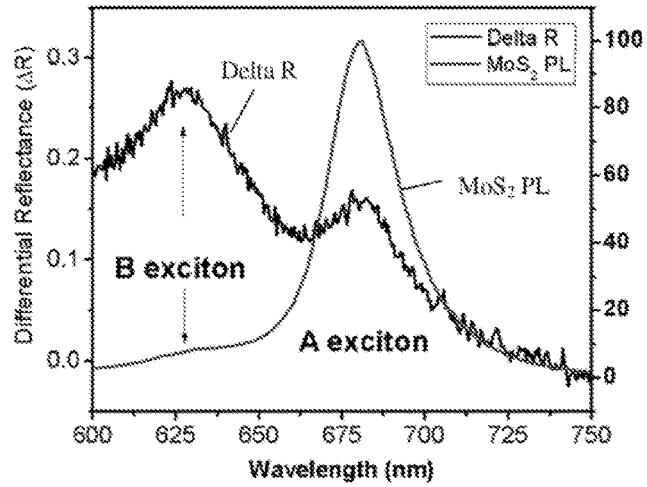
FIG. 6C
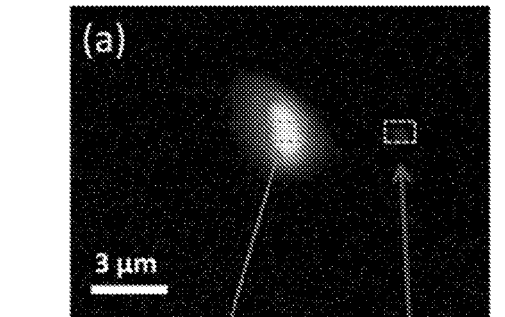
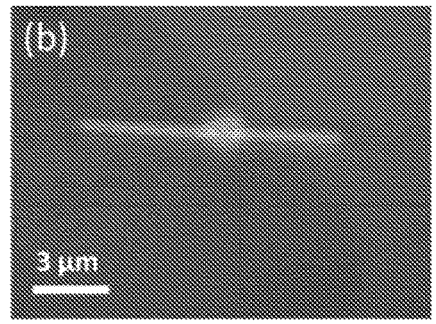
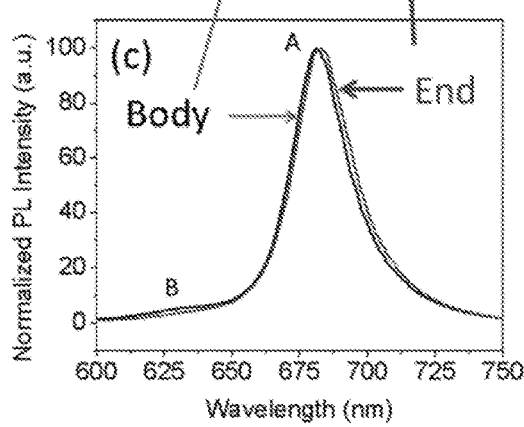
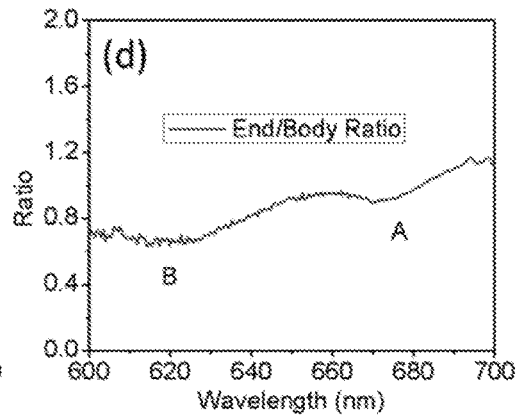
FIGS. 7a-7d

METHOD TO FABRICATE CHIP-SCALE ELECTRONIC PHOTONIC (PLASMONIC)-INTEGRATED CIRCUITS

RELATED APPLICATIONS

This application claims the benefit of U.S. Provisional Patent Application No. 62/188,905 filed on Jul. 6, 2015, which is incorporated herein by reference.

STATEMENT REGARDING FEDERALLY SPONSORED RESEARCH

This invention was made with government support under Grant No. ECCS-1240510, awarded by the National Science Foundation. The government has certain rights in the invention.

FIELD OF THE INVENTION

This invention relates to electronic plasmonic-integrated circuits (EPICs). More particularly, to EPICs with transition metal dichalcogenide (TMD).

BACKGROUND OF INVENTION

When light is confined and propagating on the surface of a metal, it is called a surface plasmon polariton, and it is a result of interaction between electrical-magnetic field of light and collective oscillations of surface charge (surface plasmon). Surface plasmon polariton (SPP) is best known for its sub-wavelength spatial confinement down to nanometer scale, as such, SPP is compatible with electronics, and can be used for nanoscale optical communication on chip level between transistors. An effort is currently being made to integrate electric circuits with nanophotonic circuits, i.e., plasmonic circuits, or in an electric circuit analog, to combine the size efficiency of electronics with the data capacity of photonic integrated circuits. Plasmonics can be understood as "light-on-metal-dielectric-interfaces," where electrons oscillate at the surface of a metal due to strong interactions with the electric field of incident light.

Electronic photonic/plasmonic integrated circuits (EPICs) are considered to have great potential in both electronics and photonics communities because an EPIC takes advantage of high-speed optical communication and highly integrated fast electronics. EPICs have been regarded as next generation technology that can potentially go beyond silicon and Moore's law. However, the realization of EPIC has remained challenging even after decades of research effort because of issues such as the need for optical communication at nanometer scales. There is no existing technology that allows successful fabrication of EPICs on a chip-scale because of material limitation and device design.

Systems and methods for EPICs discussed herein demonstrate how a new generation of integrated circuits can be fabricated.

SUMMARY OF INVENTION

In one embodiment, a base device configuration may provide nanowire(s) or plasmonic waveguide placed on single crystals of monolayer of a transition metal dichalcogenide (TMD). As a nonlimiting example, the TMD may include $MoS_2$, $WS_2$, or $WSe_2$. As a nonlimiting example, the waveguide may be Ag nanowire(s), Au nanowire(s), Cu nanowires, or slot waveguides of the same materials. The TMD may be positioned on a suitable substrate. The TMD may be placed in contact with one or more electrodes. The TMD-based device converts electrical signal to nanowire surface plasmon polariton (SPP) or vice versa. In some embodiments, the base TMD device converts the electrical signal to SPP and then another TMD device detects the SPP on the other end of waveguide. The capability of converting electrical signal to optical pulse and then back to electrical signal form the basic function for electronic plasmonic integrated circuits (EPICs).

In some embodiments, the device configuration may serve as a base material that integrated circuits may be fabricated on. As nonlimiting examples, transistors, optical detectors, photodetectors, optoelectronic/plasmonic modulators, plasmonic waveguides, plasmonic amplifiers, other semiconductor devices, other optoelectronic devices, or the like can be fabricated on the base material.

The foregoing has outlined rather broadly various features of the present disclosure in order that the detailed description that follows may be better understood. Additional features and advantages of the disclosure will be described hereinafter.

BRIEF DESCRIPTION OF THE DRAWINGS

For a more complete understanding of the present disclosure, and the advantages thereof, reference is now made to the following descriptions to be taken in conjunction with the accompanying drawings describing specific embodiments of the disclosure, wherein:

FIGS. 3e-3h show photoluminescence spectrum and SPP spectra, SPP spectra from various points, ratios of spectra 1B and 1A to the spectrum of $WS_2$, and ratio of the spectrum of 3B/3A and spectrum of $WS_2$;

FIGS. 6a-6c respectively show two images of positions of photoluminescence and reflectance measurements, and a plot of photoluminescence and differential reflectance spectra of monolayer $MoS_2$;

FIGS. 7a-7d respectively show an excitation image, corresponding luminescence image, a plot of normalized intensity v. wavelength for a body and an end, and a plot of the end/body ratio for $MoS_2$.

DETAILED DESCRIPTION

Figure 1A:
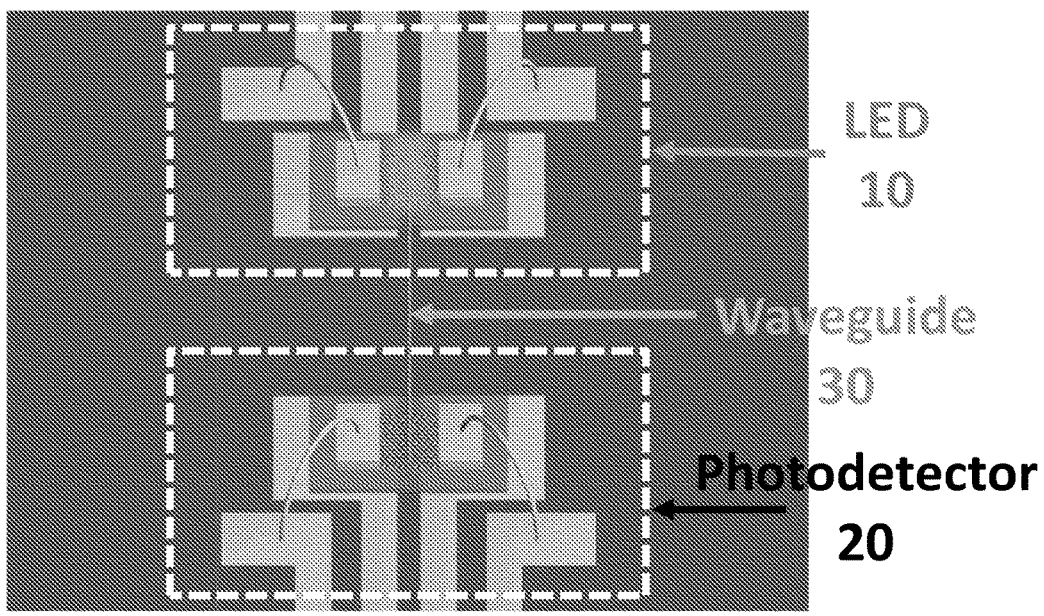
FIGS. 1a-1b shows a schematic of a base configuration suitable for an electronic plasmonic integrated circuit.

Refer now to the drawings wherein depicted elements are not necessarily shown to scale and wherein like or similar elements are designated by the same reference numeral through the several views.

Referring to the drawings in general, it will be understood that the illustrations are for the purpose of describing particular implementations of the disclosure and are not intended to be limiting thereto. While most of the terms used herein will be recognizable to those of ordinary skill in the art, it should be understood that when not explicitly defined, terms should be interpreted as adopting a meaning presently accepted by those of ordinary skill in the art.

It is to be understood that both the foregoing general description and the following detailed description are exemplary and explanatory only, and are not restrictive of the invention, as claimed. In this application, the use of the singular includes the plural, the word "a" or "an" means "at least one", and the use of "or" means "and/or", unless specifically stated otherwise. Furthermore, the use of the term "including", as well as other forms, such as "includes" and "included", is not limiting. Also, terms such as "element" or "component" encompass both elements or components comprising one unit and elements or components that comprise more than one unit unless specifically stated otherwise.

Systems and methods for forming electronic photonic/plasmonic integrated circuits (EPICs) are discussed herein. The monolithic integration of electronics and photonics has attracted enormous attention due to its potential applications. However, prior attempts have not demonstrated viable options for EPICs. Silicon is poor candidate due to its nature of indirect bandgap, whereas a direct bandgap semiconductor is not necessarily sufficient for EPIC either even though it is ideal for both electronics and photonics. The system and methods proposed herein utilize suitable material that should be able to emit and absorb light at the same wavelength, and thus, the conversion between electrical and optical information could be realized on the same material platform.

Transition metal dichalcogenides (TMDs) have been used to make transistors, lasers, light-emitting diodes and optoelectronic modulators. As discussed further herein it was discovered that two-dimensional TMDs may serve as a platform to fabricate EPICs. It is shown that TMDs have unique properties to make integrated electronic photonic circuits. It is the unique exciton resonances in optical emission and absorption that distinguish monolayer TMDs from conventional semiconductors. Such an atom-like emission-absorption relationship is enabled by large exciton binding energy and direct exciton transition in monolayer TMDs. By monitoring spectral and intensity evolutions of SPP propagating along the plasmonic waveguide on TMDs, we have not only separated absorption by monolayer TMDs from propagation loss due to plasmonic waveguide, but also revealed that absorption of SPP exhibits the same exciton resonance as in photoluminescence. This demonstration of generation and detection of SPP at the same exciton wavelength—demonstrates the potential for nanoscale optical communication, and paves the way for chip-level fully integrated electronic-photonic circuits.

In some embodiments, a basic optoelectronic device or electronic photonic/plasmonic integrated circuit may provide an emitter (e.g. LED), light sensor (e.g. photodetector), or both. In some embodiments, the emitter or light sensor may comprise a waveguide coupled to a TMD layer. The TMD layer may be a two-dimensional (2D) monolayer formed from a transition metal dichalcogenide. In other words the TMD layer may be a single, planar atomic layer formed from a transition metal dichalcogenide. Transition metal dichalcogenides have a general formula $MX_2$, where M is a transition metal and X is a chalcogenide. As a nonlimiting embodiment, the transition metal may be any suitable transition metal (e.g. Mo, W, etc.) and the chalcogenide may be S, Se, or Te. The TMD layer may be coupled to a first set of electrodes (e.g. anode, cathode, or the like). The TMD layer may be positioned on an insulating layer, semiconductive layer, or substrate. In some embodiments, a second set of electrodes may be optionally provided, such as, but not limited to, gate electrodes provide below the insulating layer, semiconductive layer, or substrate. This basic optoelectronic device allows light signals to be converted into electric signals or vice versa, or more particularly electric signals to be converted to surface plasmon polaritons (SPPs) or vice versa. In some embodiments, the basic optoelectronic device may be referred to herein as an EPIC. The EPIC may provide an emitter, a photodetector, or both an emitter and photodetector that share a common waveguide.

As a nonlimiting example, the use of monolayer $WS_2$ and silver nanowires is discussed further herein is certain examples to demonstrate the efficient coupling of exciton photoluminescence from $WS_2$ to nanowire surface plasmon polariton, and subsequent strong absorption of the surface plasmon polariton by $WS_2$. Owing to large exciton-binding energy in monolayer transition metal dichalcogenides, both absorption and emission spectra are characterized by distinct excitonic transition. Regarded as the materials for both electronics and photonics, in some embodiments, transition metal dichalcogenides provide the right platform to develop on-chip electronic plasmonic-integrated circuits.

The on-chip monolithic integration of electronic and photonic circuits would not only increase the speed of computation with reduced power consumption, but also provides new applications, such as, but not limited to, quantum information processing and chemical or biological sensing. This integration is made possible by sub-wavelength confinement of light on metallic nanostructures so that photonic circuits can be miniaturized on a similar nanometer scale to electronics. While local electrical detection of SPP using Ge nanowires, integrated metal-semiconductor-metal photodetector to detect gap SPPs, and direct SPP generation by electricity realized through nanometer scale light-emitting diodes have been discussed, it should be noted that these devices were designed to perform only one-directional conversion between electrical signals and surface plasmons, while a complete electronic plasmonic-integrated circuit (EPIC) requires a bidirectional conversion. As such, the proposed EPIC systems and methods discussed herein are the first examples providing bidirectional conversion between electrical signals and surface plasmons.

As discussed further herein, two-dimensional (2D) transition metal dichalcogenides (TMDs) are identified as a suitable material for EPICs because TMDs are able to emit and absorb light at the same wavelength determined by direct excitonic transition. Thus, the conversion between electrical and optical information could be realized on the same material platform. Further discussion of a nonlimiting example below demonstrates the generation, propagation, and absorption of SPPs on monolayer $WS_2$ or $MoS_2$ integrated with Ag plasmonic waveguides. While the examples below may discuss specific examples of materials, arrangements, set-ups, formulations, and the like, these examples are provided for illustrative purposes only and shall be understood to be nonlimiting examples.

Large-sized monolayer $WS_2$ and $MoS_2$ for these nonlimiting examples are synthesized by chemical vapor deposition based on recently developed methods, such as discussed in S. Najmaei et al., *Vapour phase growth and grain boundary structure of molybdenum disulphide atomic layers*, Nat. Mater. 2013, 12, 754 and C. X. Cong et al., *Synthesis and Optical Properties of Large-Area Single-Crystalline 2D Semiconductor $WS_2$ Monolayer from Chemical Vapor Deposition*, Adv. Opt. Mater. 2014, 2, 131.

Figure 1B:
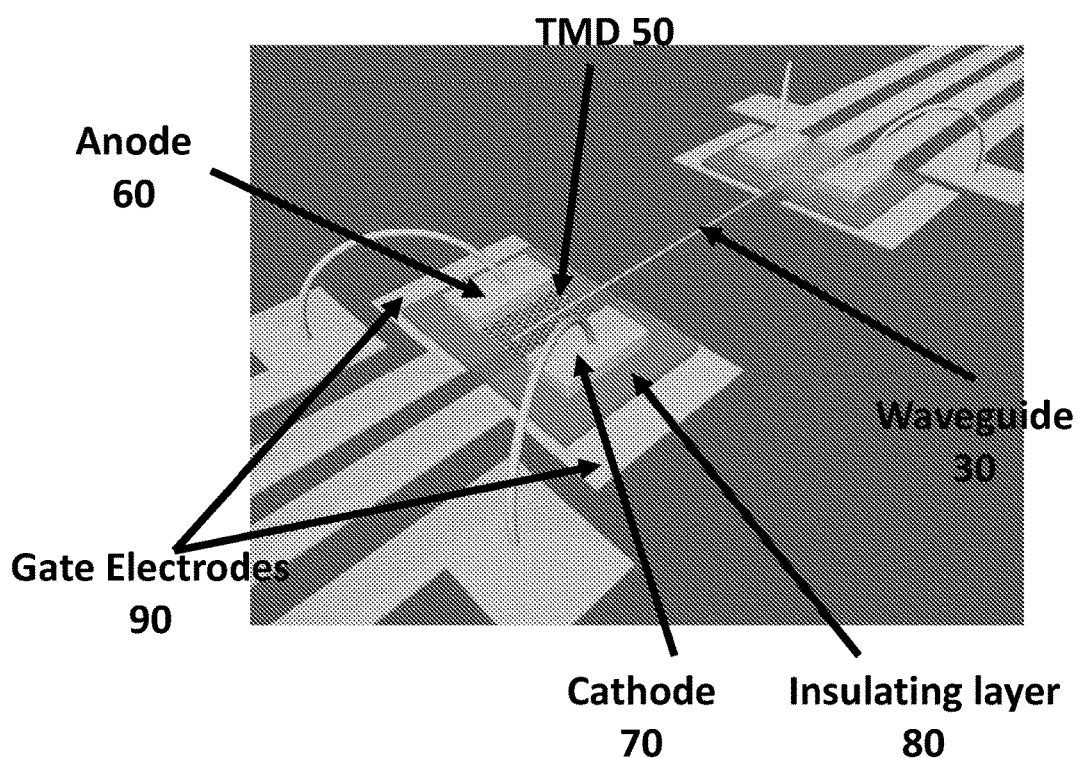

FIG. 1a-1b shows a schematic example of a base device configuration. As shown, a basic system may provide an emitter 10 coupled or connected to a photodetector 20 by a waveguide 30. The emitter 10 may receive electric signals and convert them into a photonic or plasmonic form that can be transmitted by the waveguide 30 (e.g. SPP). The photonic or plasmonic signal transmitted over the waveguide 30 may be received by photodetector 20, which converts the photonic or plasmonic signal back into an electric signal. It shall be apparent that the emitter 10 and photodetector 20 allow the waveguide 30 to act as a photonic or plasmonic bridge.

FIG. 1b is view illustrating a detailed arrangement of an emitter or photodetector for an EPIC. As noted previously, the emitter is responsible for converting an electric signal into a photonic or plasmonic signal, whereas the photodetector converts a photonic or plasmonic signal into an electric signal. A basic structure of the emitter/photodetector may comprise a waveguide 30 positioned on an active layer or transition metal dichalcogenide (TMD) layer 50. The TMD layer 50 may be coupled to electrodes, such as, but not limited to, an anode 60 and cathode 70 positioned on opposite ends of the TMD layer 50. The electrodes, TMD layer 50, or both may be positioned on top of an insulating layer 80. In some embodiments, electrodes 90 (e.g. gate electrodes) may also be coupled the emitter/photodetector, such as, but not limited to, gate electrodes 90 positioned below the insulation layer 80.

In some embodiments, the method of forming the optoelectronic device may involve depositing the TMD layer 50, such as on a substrate or insulating layer 80. The waveguide 30 is coupled to the TMD layer 50. Further, electrodes 60, 70 may be deposited and coupled to the TMD layer 50. The waveguide 30, TMD layer 50, and electrodes 60, 70 provide the basic components of the optoelectronic device that are needed for an emitter or photodetector that allow electric energy to be converted to optical energy or vice versa. In embodiments involving integration of other optic and/or electronic devices, it may be desirable to incorporate other steps. As a nonlimiting example, gate electrodes 90 may be formed below an insulating layer 80 to provide an integrated transistor. As another nonlimiting example illustrated in FIGS. 1a-1b, each end of waveguide 30 may be coupled to respective TMD layers 50, electrodes 60, 70, insulating layers 80, and gate electrodes 90. One end may function as an emitter 10, whereas the other end may function as a photodetector 20, thereby allowing transistors to communicate optically via waveguide 30. It should be apparent that the addition of a photodetector merely requires deposition of a $2^{nd}$ 2D monolayer (or second TMD layer), deposition of second electrodes coupled to the second TMD layer (and optionally gate electrodes), and coupling to the shared waveguide. The deposition steps for the photodetector 20 may be combined with the deposition steps for the emitter 10 or performed separately.

As a nonlimiting example, nanowire(s) acting as a waveguide are placed on a TMD layer. The waveguide may be a metal or metal and dielectric that is suitable for SPPs, and the TMD layer may be a 2D monolayer that is crystalline. As a nonlimiting examples, the TMD may be formed from $MoS_2$, $WS_2$, $WSe_2$, or a combination thereof. As a nonlimiting examples, the plasmonic waveguides may be Ag nanowire(s), Au nanowire(s), Cu nanowire(s), or slot waveguides of such materials. In some embodiments, the abovenoted nanowire(s) may include a dielectric layer. The TMD may be positioned on a suitable insulator substrate, such as a $SiO_2$/Si substrate, quartz substrate, or other insulating substrates. The electrodes 60, 70, 90 may be formed from any suitable conductor. In the case where the TMD layer 50 is for an emitter, such as a light emitting diode (LED) or laser, the device is used to convert an electrical signal to SPP of the waveguide 30. On the other side of the waveguide 30, a photodetector will receive the SPP and convert it to electrical information. As shown in FIGS. 1a-1b, it should be noted that the emitter and the photodetector may have a similar structure, which is possible due to the bidirectional nature of the TMD layer.

In some embodiments, the monolayer TMD may serve as a base material that integrated circuits may be fabricated on. As nonlimiting examples, transistors, optical detectors, photodetectors, optoelectronic/plasmonic modulators, plasmonic waveguides, plasmonic amplifiers, other semiconductor devices, other optoelectronic devices, or the like may be fabricated on the base material. While copper is traditionally used to link components of an integrated circuit, the plasmonic waveguide may be utilized to provide an optical link between transistors in the EPICs discussed herein.

The base device may be suitable circuit components and large scale production. In some embodiments, the monolayer of TMD may be CVD-grown on a suitable substrate. In some embodiments, the CVD deposited TMDs may have low doping, which may lead to a strong and single exciton photoluminescence peak. Notably, CVD materials can be grown in large sizes and on large scales, and are suitable for various device applications. Plasmonic waveguides made of Ag, Au or copper may be fabricated on the TMD. Transistors, optical detectors, optoelectronic modulators, metal plasmonic waveguides, other semiconductor devices, other optoelectronic devices, or the like may be fabricated and integrated using the existing lithographic or silicon technology.

FIGS. 1a-1b also show a nonlimiting example of on-chip optical communication between two transistors. A LED/laser 10 and/or photodetector 20 may be electronically coupled to plasmonic waveguide 30 via traces (not shown). The LED 10 may be optically coupled to a photodetector 20 via a waveguide 30 on a substrate 80 to allow photonic data communication. As shown for the LED 10, the TMD layer 50 is able to receive the electrical signal from electrodes 60, 70, 90 and convert it to light, which forms SPPs that can propagate across the waveguide 30. The photodetector 20 receives the SPP signal from the waveguide 30, and is able to absorb and convert the photonic energy to electrical energy to be transmitted to the traces (electrical contacts).

The following examples are included to demonstrate particular aspects of the present disclosure. It should be appreciated by those of ordinary skill in the art that the methods described in the examples that follow merely represent illustrative embodiments of the disclosure. Those of ordinary skill in the art should, in light of the present disclosure, appreciate that many changes can be made in the specific embodiments described and still obtain a like or similar result without departing from the spirit and scope of the present disclosure.

As a nonlimiting example (which shows that the proposed devices will work in principle), silver (Ag) nanowires with a diameter of ~120 nm (Agnws-120 from ACSMATERIAL) are directly placed on single crystals of monolayer $WS_2$ on a $SiO_2$/Si or quartz substrate. Light emission from $WS_2$ is achieved by optical excitation using a 532-nm laser through a microscopy objective. Digital cameras equipped with charge-coupled devices (CCDs) are used to image laser excitation as well as light emissions from $WS_2$ and surface plasmons. Through a pinhole in the imaging plane of the objective, emission spectra from selected areas are obtained with a grating spectrometer.

Figure 2A:
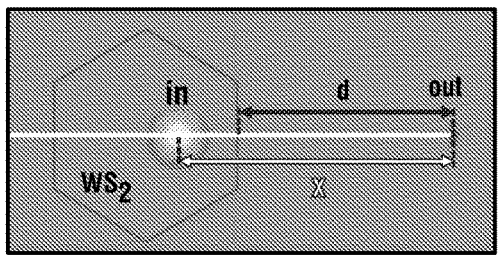
FIGS. 2a-2c respectively show a schematic for generating an exciton surface plasmon polariton (SPP) by photoexcitation, optical images of two devices FIGS. 2d-2e respectively show photoexcitation (top) and SPP images and a graph of intensity as a function of SPP propagation distance.
Figures 2B, 2C:
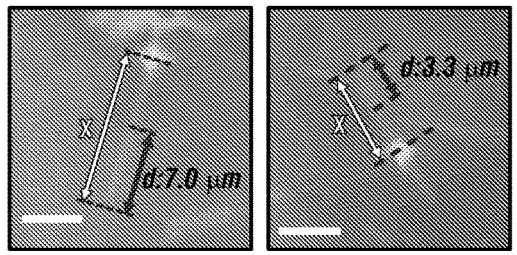
Figure 2D:
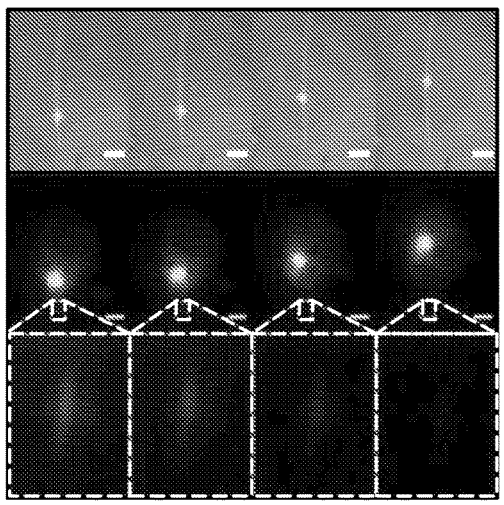
Figure 2E:
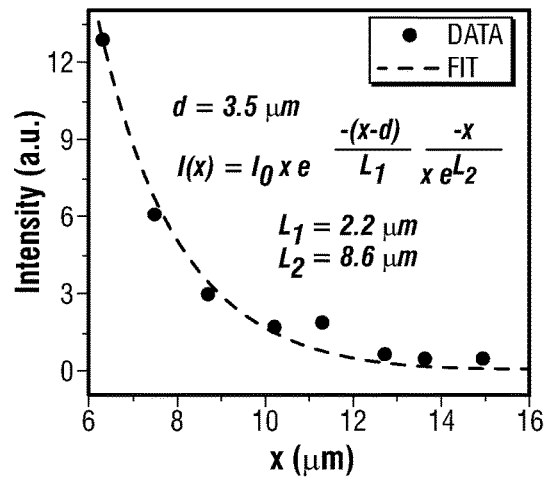

FIGS. 2a-2e show absorption of an exciton surface plasmon polariton by $WS_2$. FIG. 2a shows a schematic of the experimental design. FIGS. 2b-2c show optical images of two devices. FIG. 2d shows photoexcitation (top) and SPP emission images (zoomed-in images at the bottom) of a third device. FIG. 2e shows intensity of the SPP end emission based on FIG. 2d as a function of distance between the photoexcitation and emission. The dashed line is the fit, and scale bars represent 5 μm.

Referring to FIG. 2a, when an exciton SPP is launched, it will go through two regions or distance x before reaching the clear end of the wire, or more specifically, the first region is the nanowire on $WS_2$, and the second one is the nanowire alone or distance d. α1 and α2 are designated as the absorption coefficients due to the nanowire and $WS_2$, respectively. The total absorption coefficient when the nanowire on $WS_2$ can be approximated as α1+α2. Thus, the end emission at the point x (e.g. out) can be expressed as $$I(x) = I_0 e^{-(\alpha 1 + \alpha 2)(x-d)} e^{-\alpha 2 * d} = I_0 e^{-\alpha 1(x-d)} e^{-\alpha 2 * x} \quad (1)$$

Here $I_0$ is the intensity of the exciton SPP at the point of photoexcitation (e.g. in). If we define propagation length $L_1$ and $L_2$ as $L_1=1/\alpha 1$, $L_2=1/\alpha 2$, then the equation can be written as $$I(x) = I_0 e^{-(\alpha 1 + \alpha 2)(x-d)} e^{-\alpha 2 * d} = I_0 e^{-(x-d)/L_1} e^{-x/L_2} \quad (2)$$

The propagation lengths $L_1$ and $L_2$ can be obtained by curve fitting Equation 2. FIG. 2b-c shows the excitation images of two devices. FIG. 2d shows a series of snapshots of laser excitation and an end emission in a third device when the distance between the excitation and the end emission increases. The distance-dependent emission is plotted in FIG. 2e. Curve fitting by Equation 2 gives us $L_1$=2.2 μm and $L_2$=8.6 μm. The propagation length L of SPP with the nanowire on $WS_2$ is ~1.8 μm based on the total absorption of α1+α2. Similar propagation lengths are also obtained from the other two devices in FIG. 2b-2c. The propagation length $L_2$ is similar to previous reported values using silver nanowires with a similar diameter.

Figure 3A:
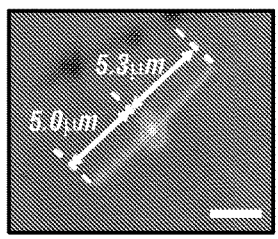
FIGS. 3a-3d respectively show an excitation image of a device and corresponding luminescence image and luminescence images when $WS_2$ is photo excited at two other locations.
Figure 3B:
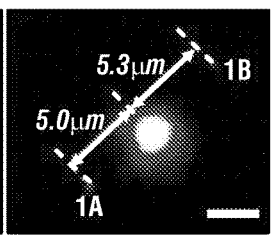
Figure 3C:
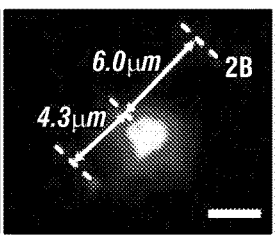
Figure 3D:
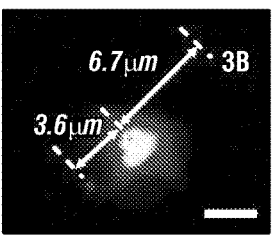
Figure 3E:
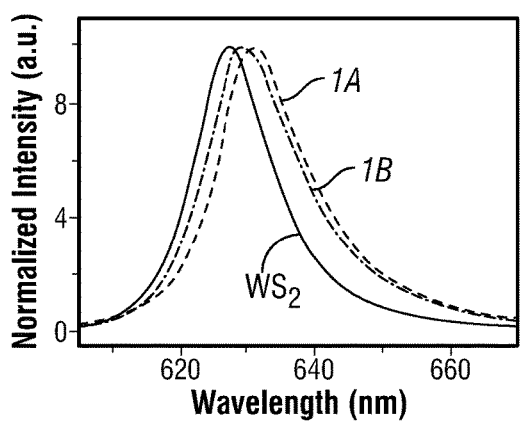
Figure 3F:
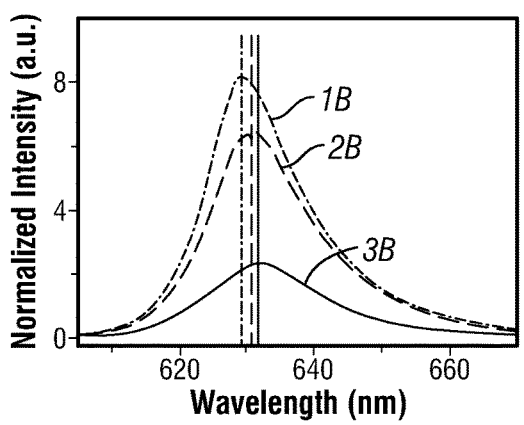

The short propagation length of exciton SPP over $WS_2$ indicates a strong self-absorption by $WS_2$. Self-absorption is typically accompanied by a spectral redshift. However, SPPs will also experience a spectral redshift from propagating along the silver nanowire waveguide because a shorter wavelength light will suffer a relatively larger loss. To distinguish these two different origins of spectral shifts, we select a new $WS_2$/nanowire device shown in FIG. 3a, in which half of the nanowire overlaps with $WS_2$ while the other half does not, but SPP emissions from both nanowire ends can be obtained. FIGS. 3a-3h show absorption and spectral redshift of exciton SPP by $WS_2$. FIG. 3a shows an excitation image of the device. FIG. 3b shows a luminescence image of FIG. 3a. FIGS. 3c-3d show luminescence images when $WS_2$ is photoexcited at two other locations along the nanowire. FIG. 3e shows the photoluminescence spectrum of $WS_2$ away from the nanowire, and SPP spectra from point 1A and 1B in FIG. 3b. Spectra are normalized to have the same peak intensity. The spectra in FIG. 3e clearly show that the spectral redshift due to $WS_2$ is much larger than that due to the Ag nanowire. The end spectra of SPP end emissions in FIG. 3f further confirm the spectral redshift accompanied by a sharp reduction in intensity as the SPP travels a longer distance over $WS_2$ toward the end. FIG. 3f shows SPP spectra from 1B, 2B, and 3B in FIGS. 3b-3d. FIG. 3g shows ratios of the spectra 1B and 1A to the spectrum of $WS_2$. FIG. 3h shows the ratio of spectrum 3B to spectrum 1B, the spectrum of $WS_2$ is the same as that in FIG. 3e. Scale bars represent 3 μm. FIG. 3b-3f show luminescence images as well as spectra of $WS_2$ and SPP end emissions.

Figure 4C:
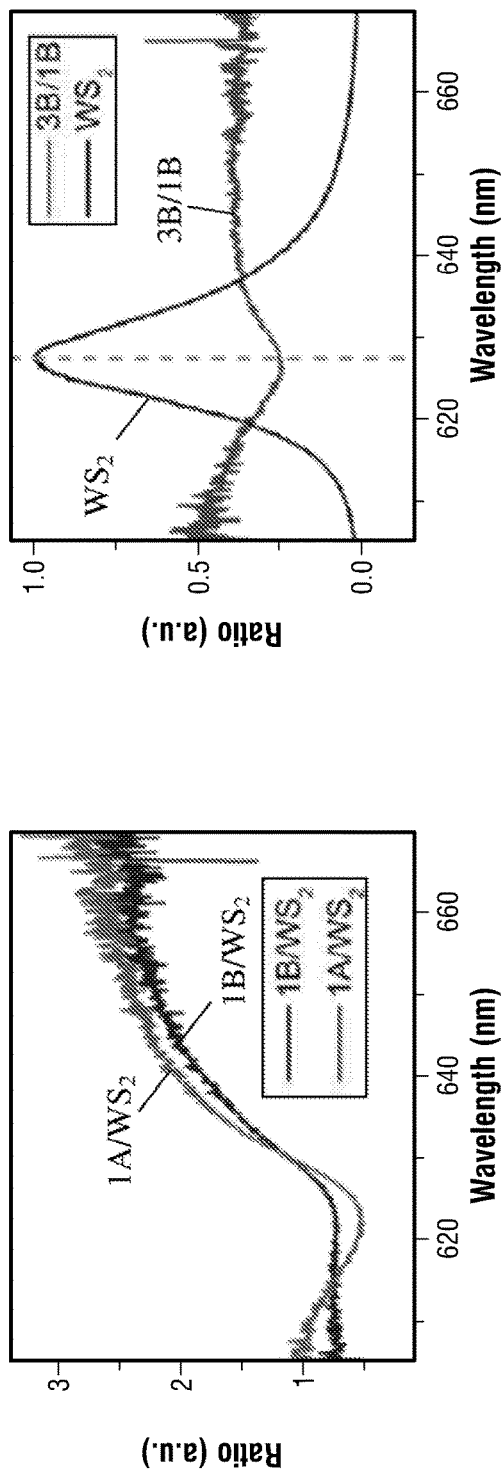
FIGS. 4a and 4c respectively show cross-sectional views of a field intensity profile of propagating SPP and field intensity distribution when light is focused on a nanowire.
Figure 4C:
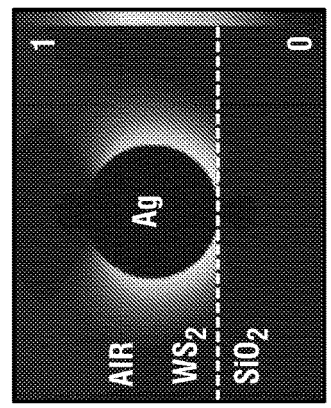
Figure 4B:
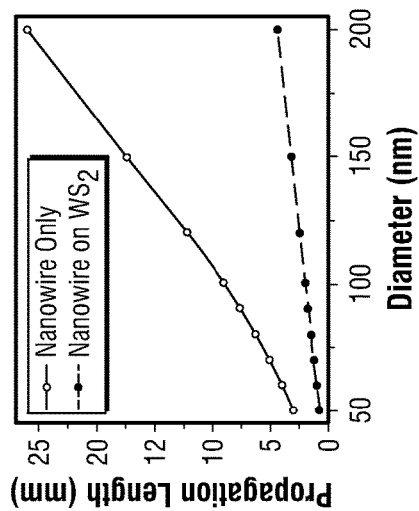
FIG. 4b shows a graph of SPP propagation lengths along a nanowire as a function of diameter with and without $WS_2$.
Figure 4A:
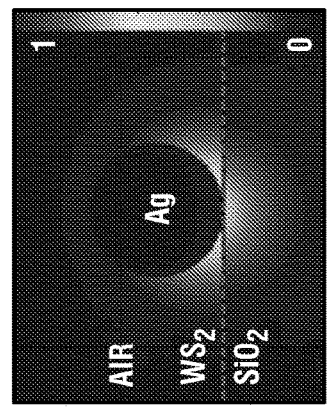
Figure 5:
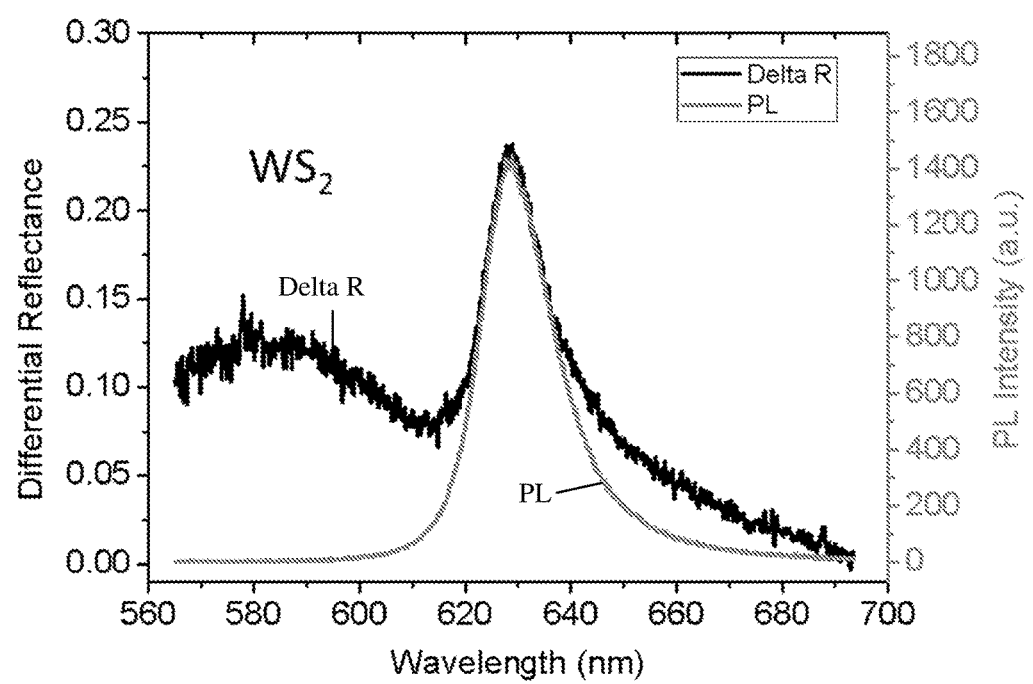
FIG. 5 shows photoluminescence spectrum as well as differential reflectance spectrum which is equivalent to the absorption spectrum of $WS_2$.
Figure 8:
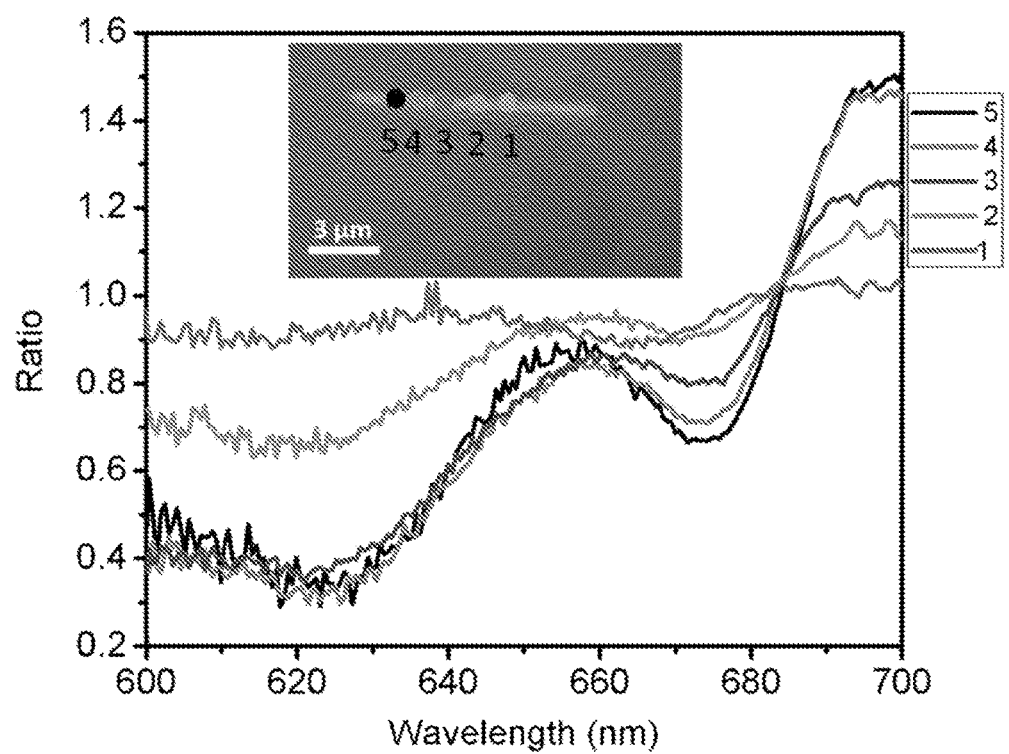
FIG. 8 shows a summary of absorption spectra from 7a-d when the excitation move along a nanowire.

To further distinguish the effect of $WS_2$ absorption from that of the nanowire waveguide propagation loss, the absorption spectrum was calculated by normalizing the SPP end emission spectra with respect to initial $WS_2$ exciton photoluminescence spectrum. FIG. 3g shows absorption spectra of 1B and 1A based on the spectra in FIG. 3e. As can be seen, both spectra exhibit a gradual decrease in absorption at longer wavelengths and show a resonant absorption near 625 nm, but the resonant absorption in spectrum 1A is more pronounced than that of 1B. The gradually decreasing absorption at the longer wavelength was attributed to the exciton SPP propagation loss along the Ag nanowire, and the absorption near 625-nm to $WS_2$. A brighter 1A than 1B indicates that the nanowire tip 1A scatters SPP more strongly than the tip 1B. The weaker $WS_2$ absorption in 1B is because of the smaller amount of $WS_2$ interacting with the exciton SPP. To obtain a better resonant absorption spectrum with less background from the nanowire propagation loss and less scattering effect from different nanowire tips, the SPP spectra from the same nanowire end was compared. FIG. 3h shows the absorption spectrum of 3B normalized against the spectrum of 1B, and a clear resonance with less background can be seen. To understand the nature of the absorption, the $WS_2$ exciton photoluminescence is included in the same graph. An excellent overlap can be observed both between absorption and photoluminescence. Similar overlap is also found between the photoluminescence and ordinary absorption spectrum obtained from differential reflectance measurement FIG. 5. FIG. 5 shows perfect overlap of photoluminescence spectrum with differential reflectance spectrum of $WS_2$. Based on these observations and recently published results, it can be conclude that exciton SPP is absorbed by the same exciton in $WS_2$. This conclusion is further supported by additional observations of systematic evolutions of exciton SPP absorption by excitons in $MoS_2$ (FIGS. 6a-8). FIGS. 6a-6c show photoluminescence and differential reflectance spectra of monolayer $MoS_2$ synthesized by chemical vapor deposition. Squares in FIGS. 6a and 6b indicate the positions of photoluminescence measurement and reflectance measurement, respectively. FIGS. 7a-7d show absorption and spectral redshift of exciton SPP like FIG. 4, but for $MoS_2$ as in FIGS. 6a-6c. FIG. 8 shows a summary of absorption spectra from FIGS. 10a-10c and 7a-7d when the excitation moves from position 1 to 5 along the nanowire (inset).

This strong absorption of exciton SPP by monolayer $WS_2$ is also a result of plasmon-enhanced strong light-matter interaction. To better understand this enhanced absorption by exciton, simulations were performed using two methods: finite-difference time-domain (FDTD) from Lumerical Inc. and finite element method from Comsol Inc. FIGS. 4a-4c show surface plasmon-enhanced interaction between $WS_2$ exciton and light. FIG. 4a shows the SPP field distribution along the nanowire/WS$_2$ at 633 nm, which is close to the wavelength of exciton SPP. This is the fundamental mode of SPP for light at both 532-nm and 633-nm wavelengths. Such a mode has been previously studied without a WS$_2$ monolayer. Although only one monolayer thick, the effect of monolayer WS$_2$ is noticeable: the field becomes more concentrated in the region where the nanowire and WS$_2$ overlap, leading to a short propagation length. Based on the optical index of WS$_2$ at the exciton resonance, a propagation length of 2.4 μm was obtain, which is in good agreement with the experimental value. The effect of WS$_2$ on the absorption of the exciton SPP is strong regardless of the nanowire diameter. FIG. 4b shows calculated SPP propagation lengths along the Ag nanowire as a function of the nanowire diameter with and without WS$_2$. As shown in FIG. 4b, the propagation length is greatly reduced when WS$_2$ is placed between the SiO$_2$ substrate and nanowire.

FIG. 4c shows a cross-sectional view of field intensity distribution when 532-nm light is focused on the Ag nanowire as shown in FIG. 2a.

For a complete EPIC, SPPs should be generated and detected locally by electricity and no external light source should be used. This integration can be envisioned based on recent demonstrations of TMD-based optoelectronic devices. The exciton SPP generation can be readily implemented by using light-emitting diodes (LEDs). In fact, our configuration of plasmonic nanowire on a flat TMD is totally compatible with the configuration of these LEDs. Similar structures can also be used to make SPP photodetectors. TMDs also offer other flexibility. For example, the SPP wavelength can be selected by choosing different TMDs, or tuned by strain or doping. Here chemically synthesized Ag nanowires are used only to demonstrate the concept, and lithographically defined plasmonic waveguides and couplers should be used for large-scale integration.

In conclusion, efficient coupling of exciton photoluminescence from WS$_2$ to exciton SPP and subsequent strong absorption of the exciton SPP by WS$_2$ has been demonstrated. This strong exciton-SPP interaction, which is manifested by short SPP propagation length and spectral redshift, is the result of surface plasmon-enhanced direct excitonic transition in monolayer TMDs. EPICs have been regarded as next generation technology that can go beyond silicon and Moore's law. Monolayer TMDs offer a new and feasible platform to realize this long-awaited goal. Because planar structure of 2D TMDs is compatible with the current lithographic fabrication process, the systems and methods discussed illustrate the feasibility of a complete EPIC.

Embodiments described herein are included to demonstrate particular aspects of the present disclosure. It should be appreciated by those of skill in the art that the embodiments described herein merely represent exemplary embodiments of the disclosure. Those of ordinary skill in the art should, in light of the present disclosure, appreciate that many changes can be made in the specific embodiments described and still obtain a like or similar result without departing from the spirit and scope of the present disclosure. From the foregoing description, one of ordinary skill in the art can easily ascertain the essential characteristics of this disclosure, and without departing from the spirit and scope thereof, can make various changes and modifications to adapt the disclosure to various usages and conditions. The embodiments described hereinabove are meant to be illustrative only and should not be taken as limiting of the scope of the disclosure.

What is claimed is:

1. An optoelectronic device comprising:
a waveguide that is surface plasmon polariton (SPP) waveguide;
a first two-dimensional (2D) monolayer coupled to a first portion of the waveguide, wherein the first 2D monolayer is a first transition metal dichalcogenide (TMD);
first electrodes coupled to the first TMD;
a second 2D monolayer coupled to a second portion of the waveguide different from the first portion, wherein the second 2D monolayer is a second TMD; and
second electrodes coupled to the second TMD, wherein the first 2D monolayer and the first electrodes are an emitter, and the second 2D monolayer and the electrodes are a photodetector coupled to the emitter via the waveguide, and the waveguide is suitable for acting as a plasmonic bridge between electronic devices.

2. The device of claim 1, further comprising an insulating layer, wherein the first 2D monolayer and the first electrodes or the second 2D monolayer and the second electrodes are positioned on the insulating layer; and
gate electrodes positioned below the insulating layer.

3. The device of claim 1, wherein the emitter converts an electric signal into a SPP.

4. The device of claim 1, wherein the photodetector converts a SPP into an electric signal.

5. The device of claim 1, wherein the optoelectronic device formed by the emitter, the photodetector, and the waveguide is bidirectional to allow conversion of an electric signal into a SPP that travels through the waveguide and conversion of the SPP back into the electric signal.

6. The device of claim 1, wherein the waveguide is formed from an Ag nanowire, Au nanowire, or Cu nanowire.

7. The device of claim 1, wherein the waveguide is a slot waveguide.

8. The device of claim 1, wherein the 2D monolayer is MoS$_2$, WS$_2$, or WSe$_2$.

9. The device of claim 1, wherein the optoelectronic device is integrated with a transistor, optical detector, optoelectronic modulator, or metal plasmonic waveguide.

10. The device of claim 1, wherein the first and the second TMDs have a general formula MX$_2$, where M is a transition metal and X is a chalcogenide.

11. A method for forming an optoelectronic device, the method comprising:
depositing a first two-dimensional (2D) monolayer, wherein the first 2D monolayer is a first transition metal dichalcogenide (TMD);
depositing first electrodes that are coupled to the first TMD;
coupling a first portion of a waveguide that is surface plasmon polariton (SPP) waveguide to the TMD;
depositing a second 2D monolayer coupled to a second portion of the waveguide different from the first portion, wherein the second 2D monolayer is a second TMD; and
depositing second electrodes coupled to the second TMD, wherein the first 2D monolayer and the first electrodes are an emitter, and the second 2D monolayer and the electrodes are a photodetector coupled to the emitter via the waveguide, and the waveguide is suitable for acting as a plasmonic bridge between electronic devices.

12. The method of claim 11, further comprising depositing an insulating layer on gate electrodes, prior to the depositing steps for the first 2D monolayer and the first electrodes or the depositing steps for the second 2D monolayer and the second electrodes, wherein the first 2D monolayer and the first electrodes or the second 2D monolayer and the second electrodes are positioned on the insulating layer and the insulating layer is positioned on top of the gate electrodes.

13. The method of claim 11, wherein the emitter converts an electric signal into a SPP.

14. The method of claim 11, wherein the photodetector converts a SPP into an electric signal.

15. The method of claim 11, wherein the optoelectronic device formed by the emitter, the photodetector, and the waveguide is bidirectional to allow conversion of an electric signal into a SPP that travels through the waveguide and conversion of the SPP back into the electric signal.

16. The method of claim 11, wherein the waveguide is formed from an Ag nanowire, Au nanowire, or Cu nanowire.

17. The method of claim 11, wherein the waveguide is a slot waveguide.

18. The method of claim 11, wherein the 2D monolayer is $MoS_2$, $WS_2$, or $WSe_2$.

19. The method of claim 11, wherein the optoelectronic device is integrated with a transistor, optical detector, optoelectronic modulator, or metal plasmonic waveguide.

20. The method of claim 11, wherein the first and the second TMDs have a general formula $MX_2$, where M is a transition metal and X is a chalcogenide.

* * * * *